United States Patent
Amirkhanyan et al.

(10) Patent No.: US 8,850,277 B2
(45) Date of Patent: Sep. 30, 2014

(54) DETECTING RANDOM TELEGRAPH NOISE INDUCED FAILURES IN AN ELECTRONIC MEMORY

(75) Inventors: Karen Amirkhanyan, Yerevan (AM);
Hayk Grigoryan, Yerevan (AM);
Gurgen Harutyunyan, Abovyan (AM);
Tatevik Melkumyan, Yerevan (AM);
Samvel Shoukourian, Yerevan (AM);
Alex Shubat, Los Altos Hills, CA (US);
Valery Vardanian, Yerevan (AM);
Yervant Zorian, Santa Clara, CA (US)

(73) Assignee: Synopsys, Inc., Mountain View, CA (US)

( * ) Notice: Subject to any disclaimer, the term of this patent is extended or adjusted under 35 U.S.C. 154(b) by 447 days.

(21) Appl. No.: 13/183,471

(22) Filed: Jul. 15, 2011

(65) Prior Publication Data
US 2013/0019132 A1    Jan. 17, 2013

(51) Int. Cl.
*G11C 29/00*    (2006.01)
*G11C 29/08*    (2006.01)
*G11C 29/10*    (2006.01)
*G11C 11/41*    (2006.01)

(52) U.S. Cl.
CPC ............ *G11C 29/08* (2013.01); *G11C 11/41* (2013.01); *G11C 29/10* (2013.01)
USPC ........................................................ 714/721

(58) Field of Classification Search
USPC ......... 714/718, 719, 720, 721, 769, 773, 799; 365/201, 185.33
See application file for complete search history.

(56) References Cited

U.S. PATENT DOCUMENTS

| | | | | |
|---|---|---|---|---|
| 5,956,350 A * | 9/1999 | Irrinki et al. | ... | 714/718 |
| 5,987,632 A * | 11/1999 | Irrinki et al. | ... | 714/711 |
| 6,067,262 A * | 5/2000 | Irrinki et al. | ... | 365/201 |
| 6,681,354 B2 * | 1/2004 | Gupta | ... | 714/725 |
| 7,093,176 B2 * | 8/2006 | Nicolaidis et al. | ... | 714/733 |
| 7,418,642 B2 * | 8/2008 | Taylor et al. | ... | 714/733 |
| 7,463,508 B2 * | 12/2008 | Pineda De Gyvez et al. | | 365/154 |
| 2009/0199057 A1 * | 8/2009 | Al-Harbi et al. | ... | 714/718 |
| 2011/0179321 A1 * | 7/2011 | Takeuchi | ... | 714/718 |
| 2013/0019130 A1 * | 1/2013 | Hakhumyan et al. | ... | 714/718 |

* cited by examiner

*Primary Examiner* — Phung M Chung
(74) *Attorney, Agent, or Firm* — Kilpatrick Townsend & Stockton LLP

(57) ABSTRACT

A method and system for testing an electronic memory. The method includes subjecting the electronic memory to a first test condition of a predetermined set of test conditions. The method also includes testing functionality of the electronic memory, a first plurality of times, for the first test condition using a predetermined test algorithm. The method further includes checking availability of a second test condition from the predetermined set of test conditions if the functionality of the electronic memory is satisfactory. Further, the method includes testing the functionality of the electronic memory, a second plurality of times, for the second test condition using the predetermined test algorithm if the second test condition is available. Moreover, the method includes accepting the electronic memory for use in a product if the functionality of the electronic memory is satisfactory.

33 Claims, 7 Drawing Sheets

⇑(W0); ⇑(W1); Delay; ⇑(R1); Delay; ⇑(W0); Delay; ⇑(R0); Delay; ⇑(R0)

DETECTING RANDOM TELEGRAPH NOISE INDUCED FAILURES IN AN ELECTRONIC MEMORY

TECHNICAL FIELD

Embodiments of the disclosure relate to detecting random telegraph noise induced failures in an electronic memory.

BACKGROUND

As electronic memories become smaller and denser, a memory array in an electronic memory has increased sensitivity to defects and noises. One such noise that can affect functionality of the electronic memories is random telegraph noise (RTN) that is caused by trapping and de-trapping of individual carriers due to active traps in gate oxide of memory cell transistors in the memory array. RTN brings about variations in threshold voltages of transistors in the memory cell. Such variations cause random failures in the memory cell leading to value of the memory cell being flipped. The random failures occur during read operations, write operations, or when the memory cell is in an idle state. Further, occurrence probability of the random failures due to RTN increases at low voltages and high temperatures.

Hence, there is a need for testing such random failures using an appropriate test algorithm with different testing conditions.

SUMMARY

An example of a method of testing an electronic memory includes subjecting the electronic memory to a first test condition of a predetermined set of test conditions. The method also includes testing functionality of the electronic memory, a first plurality of times, for the first test condition using a predetermined test algorithm. The method further includes checking availability of a second test condition from the predetermined set of test conditions if the functionality of the electronic memory is satisfactory. Further, the method includes testing the functionality of the electronic memory, a second plurality of times, for the second test condition using the predetermined test algorithm if the second test condition is available. Moreover, the method includes accepting the electronic memory for use in a product if the functionality of the electronic memory is satisfactory.

An example of a computer program product stored on a non-transitory computer-readable medium that when executed by a processor, performs a method of testing an electronic memory includes the steps of subjecting the electronic memory to a first test condition of a predetermined set of test conditions, and testing functionality of the electronic memory, a first plurality of times, for the first test condition using a predetermined test algorithm. The computer program product further includes checking availability of a second test condition from the predetermined set of test conditions if the functionality of the electronic memory is satisfactory. Further, the computer program product includes testing the functionality of the electronic memory, a second plurality of times, for the second test condition using the predetermined test algorithm if the second test condition is available. Moreover, the computer program product includes accepting the electronic memory for use in a product if the functionality of the electronic memory is satisfactory.

An example of a system includes a communication interface in electronic communication with one or more electronic devices. The system also includes an electronic memory that stores instructions. The system further includes a processor responsive to the instructions to subject the electronic memory to a first test condition of a predetermined set of test conditions. The processor is also responsive to the instructions to test functionality of the electronic memory, a first plurality of times, for the first test condition using a predetermined test algorithm. The processor is further responsive to the instructions to check availability of a second test condition from the predetermined set of test conditions if the functionality of the electronic memory is satisfactory. Further, the processor is responsive to the instructions to test the functionality of the electronic memory, a second plurality of times, for the second test condition using the predetermined test algorithm if the second test condition is available. Moreover, the processor is responsive to the instructions to accept the electronic memory for use in a product if the functionality of the electronic memory is satisfactory.

BRIEF DESCRIPTION OF THE VIEWS OF DRAWINGS

In the accompanying figures, similar reference numerals may refer to identical or functionally similar elements. These reference numerals are used in the detailed description to illustrate various embodiments and to explain various aspects and advantages of the present disclosure.

FIG. 2 is an exemplary test algorithm, in accordance with one embodiment;

DETAILED DESCRIPTION OF THE EMBODIMENTS

Due to increased density in an electronic memory, a memory array of the electronic memory is sensitive to defects and noises, for example random telegraph noise (RTN). Examples of the electronic memory include, but are not limited to, a static random access memory (SRAM), a dynamic random access memory, a serial access memory, and a content addressable memory. The electronic memory can be included in an electronic device. Examples of the electronic device includes, but is not limited to, a computer, a laptop, a mobile device, a hand held device, and a personal digital assistant (PDA). RTN in the electronic memory causes variations in threshold voltages of transistors in a memory cell of the memory array. If the memory cell does not have sufficient noise margin, such variations can cause functional failures. Since RTN is caused by capture and emission of a charge carrier at a trap in gate oxide of the transistors in the memory cell, the variations in the threshold voltages depend on time. The variations in the threshold voltages cause random failures in the memory cell leading to value of the memory cell being flipped. RTN increases at low voltages and high temperatures.

The random failures caused by RTN can result in one or more static faults. However, such random failures can be detected if testing is performed using an appropriate test algorithm a plurality of times with appropriate test conditions. In the present disclosure, a March test algorithm is disclosed for testing the random failures caused by RTN.

Figure 1:
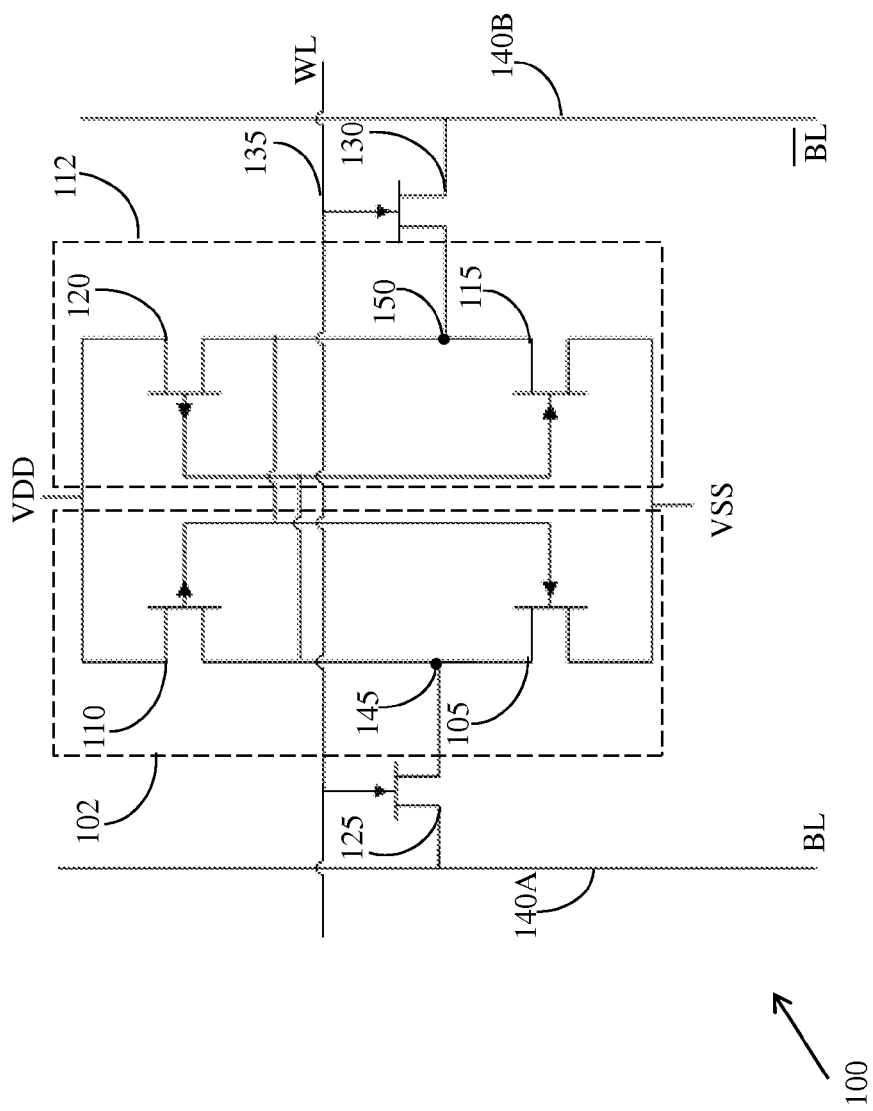
FIG. 1 illustrates a memory cell, in accordance with one embodiment.
Figure 2:
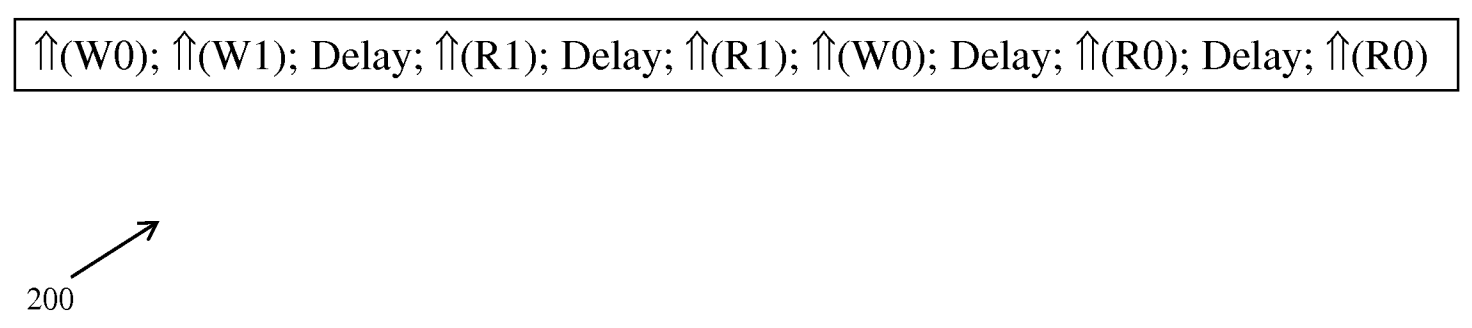

The memory cell in the electronic memory and the March test algorithm is explained in conjunction with FIG. 1 and FIG. 2 respectively.

FIG. 1 illustrates a memory cell, for example an SRAM cell 100, in accordance with one embodiment. The SRAM cell 100, which is a six-transistor SRAM cell, includes a flip-flop formed by a pair of cross-coupled inverters, and a pair of pass transistors. A first inverter 102 of the pair of cross-coupled inverters includes a first transistor 105 and a second transistor 110. A second inverter 112 of the pair of cross-coupled inverters includes a third transistor 115 and a fourth transistor 120. The pair of pass transistors includes a first pass transistor 125 and a second pass transistor 130. The pair of pass transistors are coupled to a word line (WL) 135 and a pair of bit lines. The word line (WL) 135 is used to address the SRAM cell 100 using a row address whereas the pair of bit lines are used to address the SRAM cell 100 using a column address.

The first transistor 105 and the second transistor 110 of the first inverter 102 are coupled together at drains and gates. A source of the first transistor 105 is coupled to a ground supply voltage (VSS) and a source of the second transistor 110 is coupled to a power supply voltage (VDD). Similarly, the third transistor 115 and the fourth transistor 120 of the second inverter 112 are coupled together at drains and gates. A source of the third transistor 115 is coupled to the ground supply voltage (VSS) and a source of the fourth transistor 120 is coupled to the power supply voltage (VDD). The drains of the first transistor 105 and the second transistor 110 of the first inverter 102 are coupled to the gates of the third transistor 115 and the fourth transistor 120 of the second inverter 112. Similarly, the drains of the third transistor 115 and the fourth transistor 120 of the second inverter 112 are coupled to the gates of the first transistor 105 and the second transistor 110 of the first inverter 102.

In some embodiments, the first transistor 105 and the third transistor 115 are n-type metal oxide semiconductor (NMOS) transistors. In some embodiments, the second transistor 110 and the fourth transistor 120 are p-type metal oxide semiconductor (PMOS) transistors.

The first pass transistor 125 has a source coupled to a bit line (BL) 140A and a gate coupled to the word line (WL) 135. The first pass transistor 125 has a drain coupled to the drains of the first transistor 105 and the second transistor 110, at a node 145. The second pass transistor 130 has a drain coupled to a complementary bit line ($\overline{BL}$) 140B and a gate coupled to the word line (WL) 135. The second pass transistor 130 has a source coupled to the drains of the third transistor 115 and the fourth transistor 120, at a node 150.

In some embodiments, the first pass transistor 125 and the second pass transistor 130 are NMOS transistors.

The pair of pass transistors is controlled by the word line (WL) 135 in order to manage connection of the SRAM cell 100 to the pair of bit lines. The pair of pass transistors is transmission gates that provide bi-directional access between the flip-flop and the pair of bit lines. The pair of pass transistors also control access to the SRAM cell 100 and are used to transfer the data during read and write operations.

During a read operation, voltages at the pair of bit lines are precharged to an equalized potential. In one example, value of the SRAM cell 100 is a logic value 1 that is stored at the node 145. A read cycle is started by precharging the pair of bit lines to the logic value 1 and subsequently driving the word line (WL) 135 to thereby enable the pair of pass transistors. Values stored at the node 145 and the node 150 are then transferred to the pair of bit lines by maintaining the bit line (BL) 140A at its precharged value of logic value 1 and discharging the complementary bit line ($\overline{BL}$) 140B through the third transistor 115 and the second pass transistor 130 to a logic value 0. The second transistor 110 and the first pass transistor 125 pull the bit line (BL) 140A toward VDD or the logic value 1.

In another example, the value of the SRAM cell 100 is the logic value 0 that is stored at the node 145. The read cycle is started by precharging the pair of bit lines to the logic value 1 and subsequently asserting the word line (WL) 135 to thereby enable the pair of pass transistors. Values stored at the node 145 and the node 150 are then transferred to the pair of bit lines by maintaining the complementary bit line ($\overline{BL}$) 140B at its precharged value of logic value 1 and discharging the bit line (BL) 140A through the first transistor 105 and the first pass transistor 125 to a logic value 0. The fourth transistor 120 and the second pass transistor 130 pull the complementary bit line ($\overline{BL}$) 140B toward VDD or the logic value 1.

In some embodiments, a difference between the pair of bit lines is further provided to a sense amplifier. The sense amplifier senses which one of the pair of bit lines have a higher voltage and thereby determines the value of the SRAM cell 100.

During a write operation, a value that needs to be written to the SRAM cell 100 is applied to the pair of bit lines. In one example, the value to be written to the SRAM cell 100 is the logic value 0. The logic value 0 is then applied to the pair of bit lines by setting the bit line (BL) 140A to the logic value 0 and the complementary bit line ($\overline{BL}$) 140B to logic value 1. In another example, the value to be written to the SRAM cell 100 is the logic value 1. The logic value 1 is then applied to the pair of bit lines by setting the bit line (BL) 140A to the logic value 1 and the complementary bit line ($\overline{BL}$) 140B to logic value 0. Subsequently, the word line (WL) 135 is driven to logic value 1 and the value that is to be stored at the node 145 is latched in.

The March test algorithm is further applied to the electronic memory in order to test the random failures caused by RTN. The March test algorithm that is applied to the memory cell, for example the SRAM cell 100, is explained in conjunction with FIG. 2.

FIG. 2 is an exemplary test algorithm, for example the March test algorithm, in accordance with one embodiment. The March test algorithm, a March Random Telegraph Noise induced Failures (RTNF) algorithm 200 is a minimal test of length 7N, where N is number of words of the memory array. The March RTNF algorithm 200 is applied to the electronic memory in order to test and detect the random failures that occur in the memory cell, due to RTN. Examples of the static faults that are generated due to the random failures caused by RTN include, but are not limited to, a stuck-at fault (SAF), a transition fault (TF), a read destructive fault (RDF), a deceptive read destructive fault (DRDF), and a data retention fault (DRF). The March RTNF algorithm 200 is applied to the electronic memory when the electronic memory is subjected to a predetermined set of test conditions, for example value of the power supply voltage (VDD) and temperature.

The stuck-at fault (SAF) occurs when the value of the memory cell is stuck at logic value 0 or logic value 1.

The transition fault (TF) occurs when the memory cell fails to undergo transitions from the logic value 0 to the logic value 1 or vice versa.

The read destructive fault (RDF) occurs when the value of the memory cell flips during a read operation, for example an R0 (read 0) operation or an R1 (read 1) operation. The flipped value is further returned.

The deceptive read destructive fault (DRDF) occurs when the value of the memory cell flips during the read operation, for example the R0 (read 0) operation or the R1 (read 1) operation. The value which is initially stored is further returned.

The data retention fault (DRF) occurs when the value of the memory cell flips after a time delay during an idle state of the memory cell.

The above static faults can be detected by applying the March RTNF algorithm 200 to the electronic memory. A March test sequence in the March RTNF algorithm 200 includes a plurality of March elements. A March element is a set of operations applied to the memory cell. Examples of the set of operations include, but are not limited to, W0 (write 0), W1 (write 1), R0 (read 0), and R1 (read 1). The set of operations of the March element are applied to a certain address before proceeding to a next address, either in an increasing order, denoted by ⇑ before a March element, or a decreasing order, denoted by ⇓.

The March RTNF algorithm 200 is of a sequence ⇑ (W0); ⇑ (W1); Delay; ⇑ (R1); Delay; ⇑ (R1); ⇑ (W0); Delay; ⇑ (R0); Delay; ⇑ (R0).

A first March element of the March RTNF algorithm 200 is ⇑ (W0). ⇑ (W0) refers to writing a logic value 0 to a consecutive sequence of addresses. A second March element is ⇑ (W1). ⇑ (W1) refers to writing a logic value 1 to the consecutive sequence of addresses. A third March element is Delay. Delay refers to insertion of a time delay by not performing any operations. A fourth March element is ⇑ (R1). ⇑ (R1) refers to reading the consecutive sequence of addresses and checking if each of the consecutive sequence of addresses outputs the logic value 1. If, during ⇑ (R1), one or more of the consecutive sequence of addresses outputs the logic value 0, it is determined that a failure has occurred and the testing is stopped. A fifth March element is Delay that refers to insertion of the time delay by not performing any operations. A sixth March element is ⇑ (R1) that refers to reading the consecutive sequence of addresses and checking if each of the consecutive sequence of addresses outputs the logic value 1. If one or more of the consecutive sequence of addresses outputs the logic value 0, it is determined that the failure has occurred and the testing is stopped.

A seventh March element is ⇑ (W0) that refers to writing a logic value 0 to the consecutive sequence of addresses. An eighth March element is Delay that refers to insertion of the time delay by not performing any operations. A ninth March element is ⇑ (R0). ⇑ (R0) refers to reading the consecutive sequence of addresses and checking if each of the consecutive sequence of addresses outputs the logic value 0. If one or more of the consecutive sequence of addresses outputs the logic value 1, it is determined that the random failures have occurred as the value of the memory cell has flipped due to RTN and the testing is stopped. A tenth March element is Delay that refers to insertion of the time delay by not performing any operations. An eleventh March element is ⇑ (R0) that refers to reading the consecutive sequence of addresses and checking if each of the consecutive sequence of addresses outputs the logic value 0. If one or more of the consecutive sequence of addresses outputs the logic value 1, it is determined that the random failures have occurred as the value of the memory cell has flipped due to RTN and the testing is stopped.

In some embodiments, Delays in the third March element, the fifth March element, the eighth March element, and the tenth March element, are dependent on different process technologies and can be of different lengths. The lengths of the Delays can be selected by a user.

In some embodiments, the electronic memory can be discarded when it is determined that the random failures have occurred and the testing is stopped.

In some embodiments, the above March test algorithm is executed multiple number of times for each of the predetermined set of test conditions, in order to increase probability that at least one read or write operation coincides with a case having highest RTN effect. The probability of detecting the RTN induced failures is thus increased. The number of times the March test algorithm is to be executed can be selected by the user based on different factors. Each test condition in the predetermined set of test conditions is characteristic of having different values of reduced VDD and increased temperature. The electronic memory is further discarded if the functionality of the electronic memory is unsatisfactory for any March element.

Figure 3:
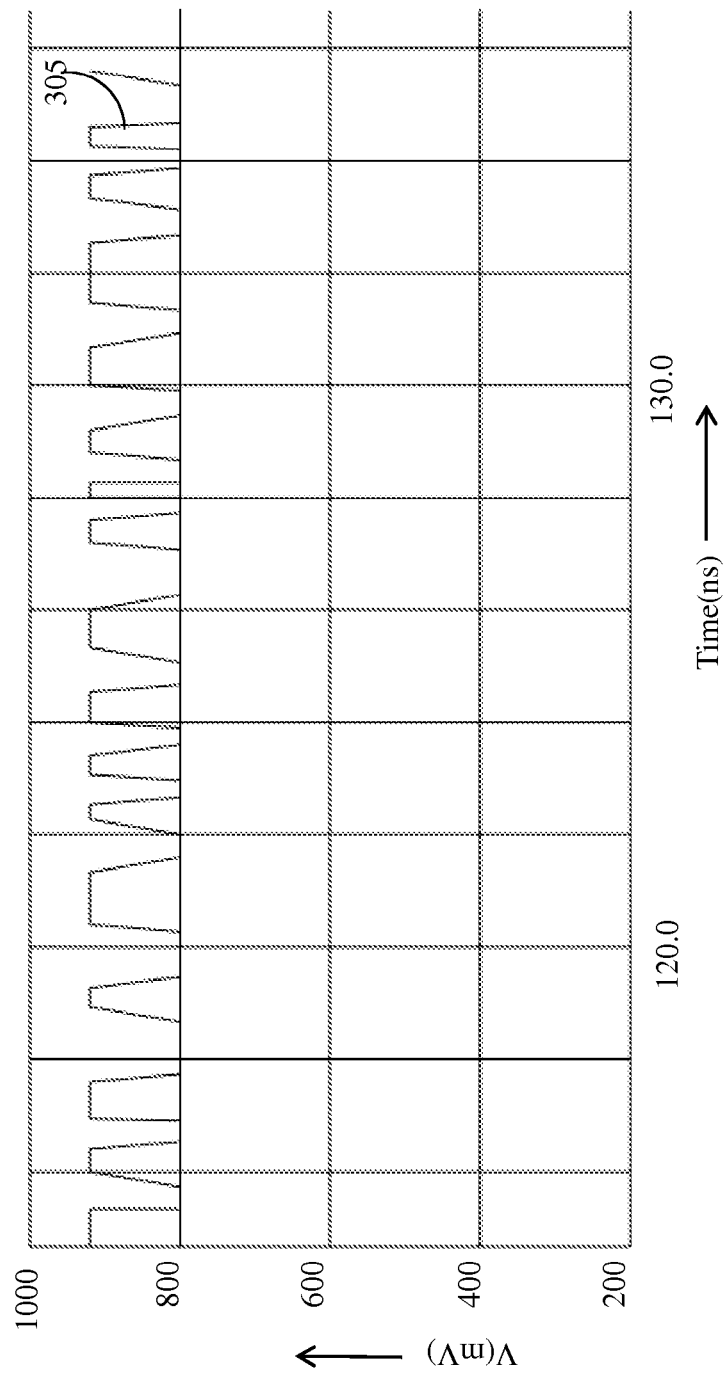
FIG. 3 is an exemplary portion of a graph illustrating voltage variation due to random telegraph noise, in accordance with one embodiment.

FIG. 3 is an exemplary portion of a graph illustrating voltage variation due to RTN, in accordance with one embodiment. The voltage variation occurs at a node, for example the node 145 in the SRAM cell 100. The voltage variation is further represented as ΔV for the node 145, and occurs in presence of RTN at a nominal value of VDD. In the exemplary portion of the graph, X-axis represents variation in time from 114 nanoseconds (ns) to 134 ns, and Y-axis represents variation in voltage from 200 millivolts (mV) to 1000 mV. A waveform 305 corresponds to the voltage variation when the nominal value of VDD (VDDnom) is 0.9V. In one example, the voltage variation at the node 145 (ΔV) is 100 mV when the nominal value of VDD (VDDnom) is 0.9V. Since the nominal value of VDD (VDDnom) is high, probability of random failures is less. If the voltage variation at the node 145 (ΔV) is 450 mV when the nominal value of VDD (VDDnom) is 0.9V, the probability of the random failures increases.

Figure 4:
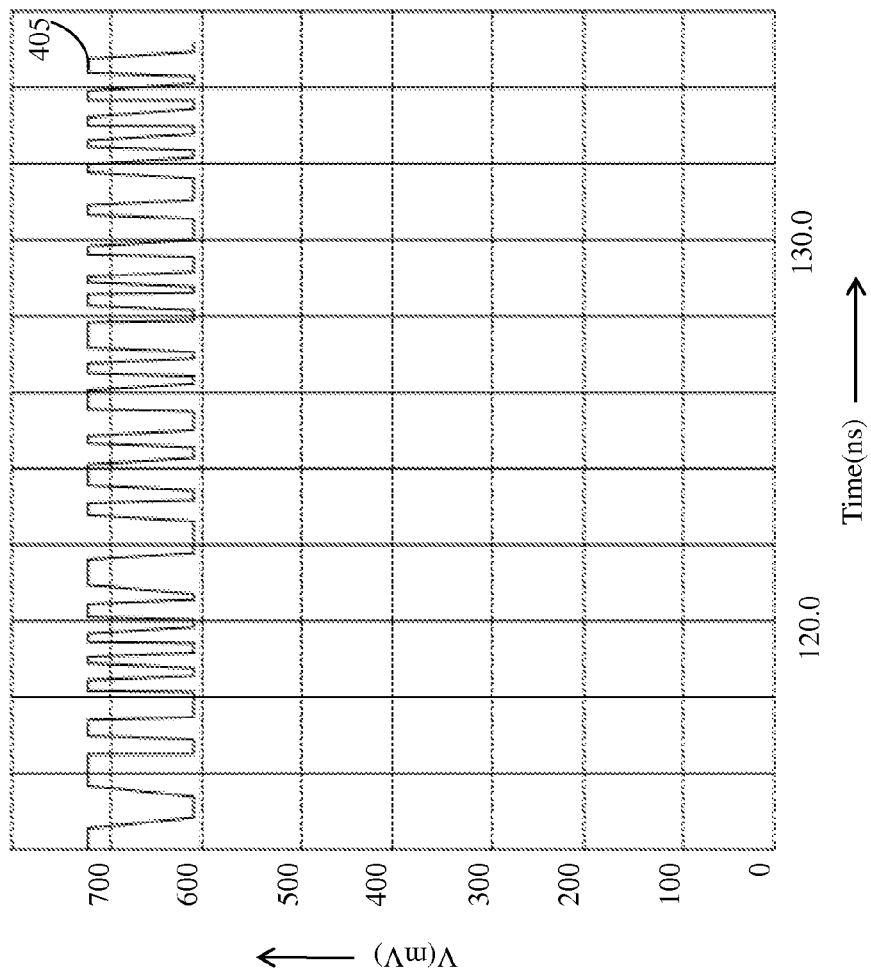
FIG. 4 is an exemplary portion of a graph illustrating voltage variation due to random telegraph noise, in accordance with another embodiment.

FIG. 4 is an exemplary portion of a graph illustrating voltage variation due to random telegraph noise, in accordance with another embodiment. The voltage variation occurs at the node, for example the node 145 in the SRAM cell 100. The voltage variation is further represented as ΔV for the node 145, and occurs in presence of RTN at a minimal value of VDD. In the exemplary portion of the graph, X-axis represents the variation in time from 114 ns to 134 ns, and Y-axis represents the variation in the voltage from 0V to 780 mV. A waveform 405 corresponds to the voltage variation when the minimal value of VDD (VDDmin) is 0.72V. In one example, the voltage variation at the node 145 (ΔV) has a value nearer to that of the voltage to enable flipping of the value of the memory cell, for example the SRAM cell 100, when the minimal value of VDD (VDDmin) is 0.72V. Hence, probability of random failures for VDDmin is higher than in case of VDDnom.

Figure 5:
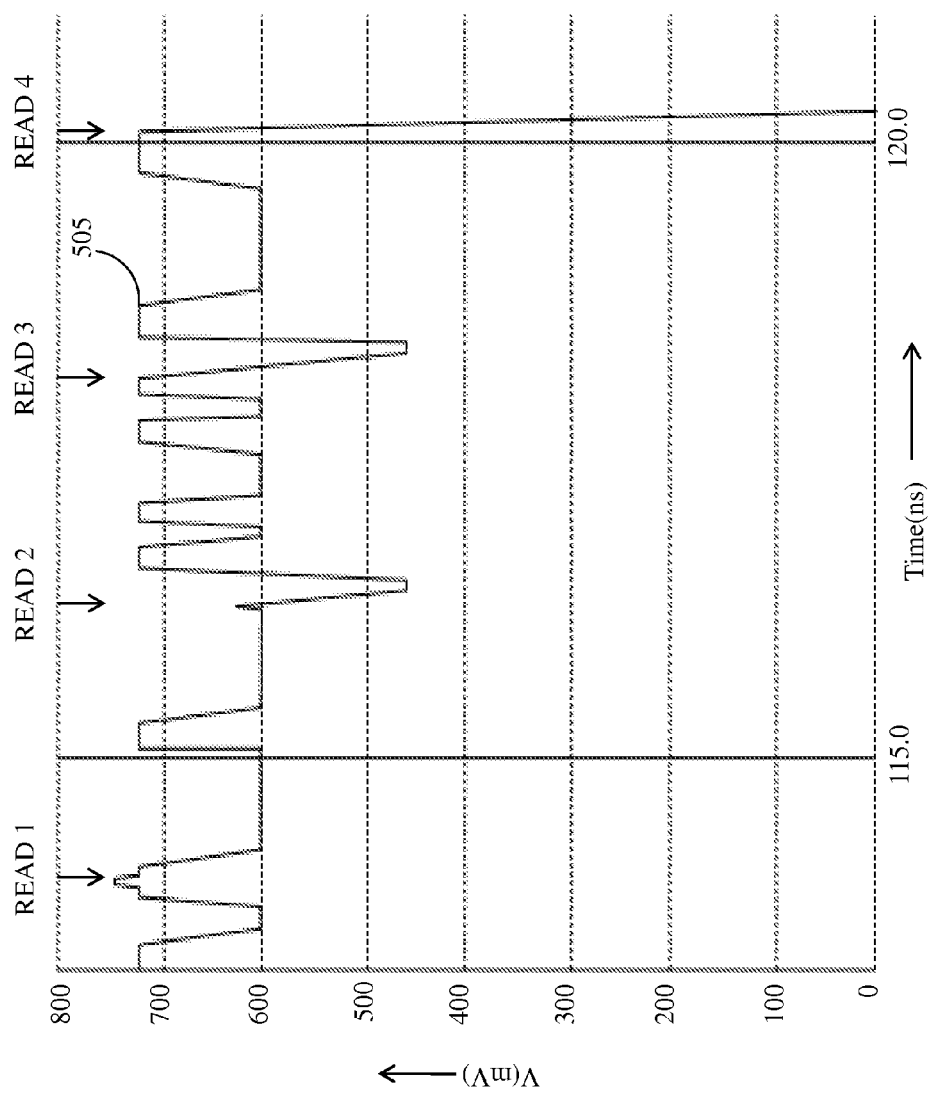
FIG. 5 is an exemplary portion of a graph illustrating occurrence of random telegraph noise induced failure, in accordance with one embodiment.

FIG. 5 is an exemplary portion of a graph illustrating occurrence of random failures due to random telegraph noise, in accordance with one embodiment. The voltage variation occurs at the node, for example the node 145 in the SRAM cell 100. The voltage variation is further represented as ΔV for the node 145, and occurs in presence of RTN. In the exemplary portion of the graph, X-axis represents the variation in time from 114 ns to 124 ns, and Y-axis represents the variation in the voltage from 0V to 800 mV. A waveform 505 corresponds to the voltage variation for different read operations. A first read operation, READ 1, succeeds as READ 1 is performed when voltage at the node 145 has a maximum value. A second read operation, READ 2, and a third read operation, READ 3, also succeed as the voltage at the node 145 has the nominal value. However, the voltage variation increases for READ 2 and READ 3 as compared to READ 1. A fourth read operation, READ 4, fails as READ 4 is performed when the voltage at the node 145 has a minimal value. The random failures in the memory cell are hence detected after several read operations using the March RTNF algorithm 200.

Figure 6:
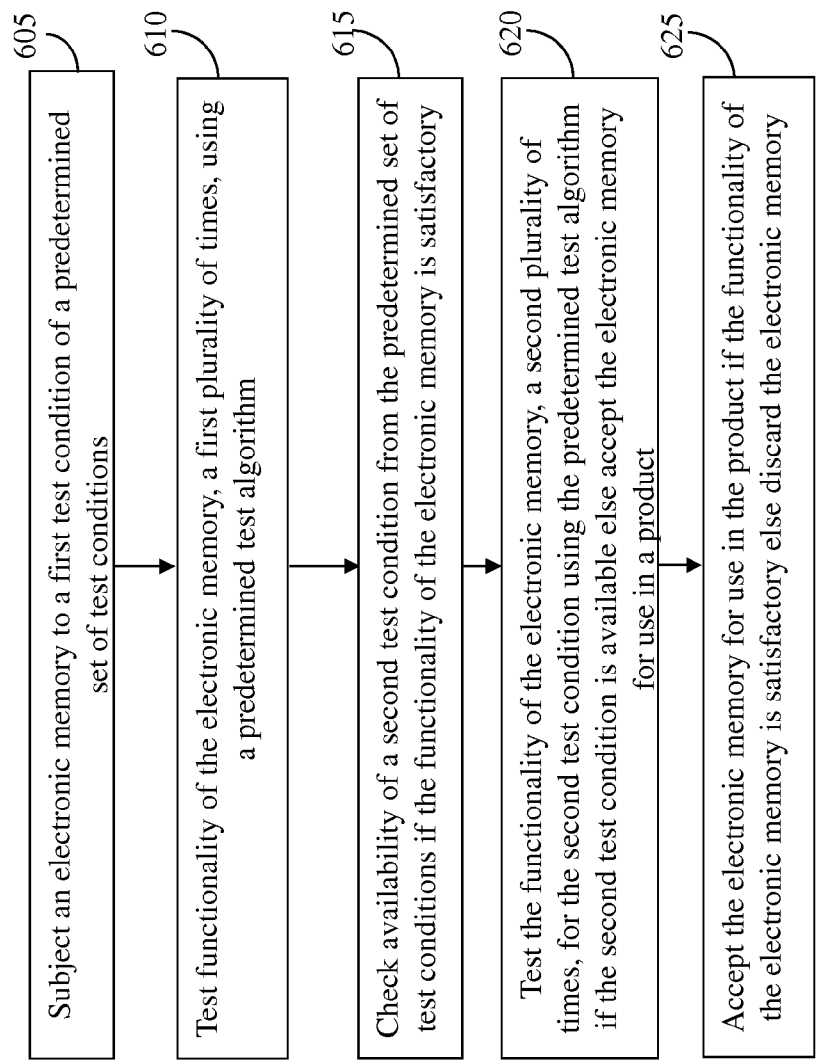
FIG. 6 is a flow diagram illustrating a method of testing a memory, in accordance with one embodiment.

FIG. 6 is a flow diagram illustrating a method of testing an electronic memory, for example a static random access memory (SRAM).

The electronic memory is connected for testing. Examples of the electronic memory include, but are not limited to, a static random access memory, a dynamic random access memory, a serial access memory, and a content addressable memory. The electronic memory stores binary logic 1 and binary logic 0 bits in memory cells of a memory array, and can allow the memory cells to be accessed randomly. Each memory cell is defined by an address that corresponds to an intersection of a row and column. A memory cell, for example the six-transistor SRAM cell 100, includes is a flip-flop that provides two states of logic value 1 and logic value 0.

The memory array is mainly sensitive to defects, for example random telegraph noise (RTN), due to increased density in the electronic memory. RTN causes variations in threshold voltages of transistors in the memory cell thereby leading to random failures in the memory cell where value of the memory cell is flipped. RTN further increases at low voltages and high temperatures. The electronic memory is hence connected for testing to avoid such random failures.

At step 605, the electronic memory is subjected to a first test condition of a predetermined set of test conditions. The predetermined set of test conditions includes a plurality of test conditions, for example the first test condition. Examples of the predetermined set of test conditions include, but are not limited to, a value of a power supply voltage (VDD), a temperature, or a combination of both. Examples of the power supply voltage (VDD) can include, but are not limited to, a read command signal voltage and a write command signal voltage.

In one example, the electronic memory is subjected to low voltage. In another example, the electronic memory is subjected to high temperature by placing the electronic memory in vicinity of the high temperature. In yet another example, the electronic memory is subjected to the first test condition having a combination of the low voltage and the high temperature.

At step 610, functionality of the electronic memory is tested, a first plurality of times, for the first test condition using a predetermined test algorithm. Similarly, the functionality of the electronic memory is also tested for each of the test conditions using the predetermined test algorithm. The electronic memory is tested for a plurality of static faults that can occur due to the random failures caused by RTN. Examples of the static faults include, but are not limited to, a stuck-at fault (SAF), a transition fault (TF), a read destructive fault (RDF), a deceptive read destructive fault (DRDF), and a data retention fault (DRF). In one example, the predetermined test algorithm includes a March test algorithm, for example the March Random Telegraph Noise induced Failures (RTNF) algorithm 200. The March RTNF algorithm 200 is used for testing the random failures caused by RTN. The March RTNF algorithm 200 is of sequence ⇑ (W0); ⇑ (W1); Delay; ⇑ (R1); Delay; ⇑ (R1); ⇑ (W0); Delay; ⇑ (R0); Delay; ⇑ (R0).

In some embodiments, the electronic memory is discarded when it is determined that the random failures have occurred for the first test condition and the testing is stopped.

At step 615, availability of a second test condition from the predetermined set of test conditions is checked if the functionality of the electronic memory is satisfactory. If the second test condition is available, step 625 is performed else the electronic memory is accepted for use in a product. In one example, the second test condition can include a reduced value of the power supply voltage (VDD) and an increased value of the temperature.

At step 620, the functionality of the electronic memory is tested, a second plurality of times, for the second test condition using the predetermined test algorithm if the second test condition is available. Using changed values of voltage or temperature in the second test condition, the electronic memory is tested for the second test condition using the March RTNF algorithm 200.

At step 625, the electronic memory is accepted for use in the product if the functionality of the electronic memory is satisfactory else the electronic memory is discarded.

In some embodiments, the electronic memory is tested multiple times for each of the predetermined set of test conditions. The electronic memory is further discarded if the functionality of the electronic memory is unsatisfactory at any one time.

Stability of the memory cell is affected due to RTN which increases with decrease in transistor dimensions. Usage of the March RTNF algorithm 200 enables testing and detection of the random failures that occur in the memory cell due to RTN. The memory cell can hence be repaired by redundancy repair or by increasing the power supply voltage (VDD). Further, increase in memory yield can be controlled.

Figure 7:
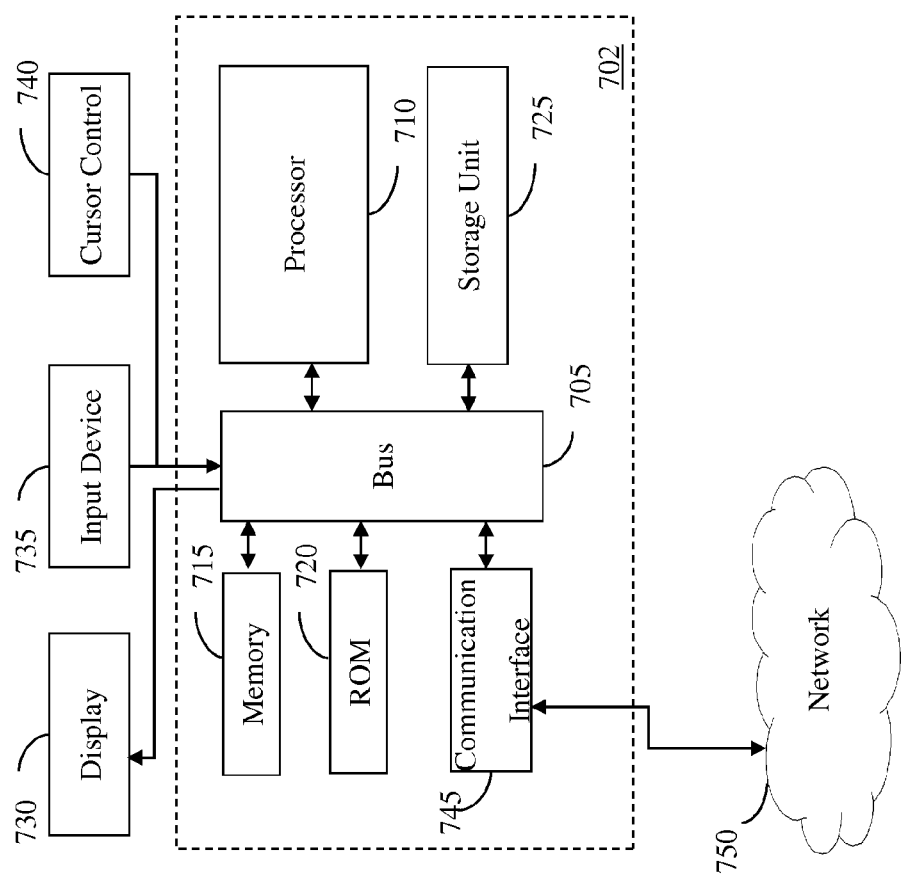
FIG. 7 is a block diagram of a system, in accordance with one embodiment.

FIG. 7 is a block diagram of a system, for example an electronic device 702, in accordance with one embodiment. The electronic device 702 includes a bus 705 for communicating information, and a processor 710 coupled with the bus 705 for processing information. The electronic device 702 also includes an electronic memory 715, for example a random access memory (RAM) coupled to the bus 705 for storing instructions to be executed by the processor 710. The electronic memory 715 can be used for storing temporary information required by the processor 710. The electronic device 702 may further include a read only memory (ROM) 720 coupled to the bus 705 for storing static information and instructions for the processor 710. A storage unit 725, for example a magnetic disk, hard disk or optical disk, can be provided and coupled to the bus 705 for storing information and instructions.

The electronic device 702 can be coupled via the bus 705 to a display 730, for example a cathode ray tube (CRT) or a liquid crystal display (LCD), for displaying information. An input device 735, for example a keyboard, is coupled to the bus 705 for communicating information and command selections to the processor 710. In some embodiments, cursor control 740, for example a mouse, a trackball, a joystick, or cursor direction keys for command selections to the processor 710 and for controlling cursor movement on the display 730 can also be present.

In one embodiment, the steps of the present disclosure are performed by the electronic device 702 in response to the processor 710 executing instructions included in the electronic memory 715. The instructions can be read into the electronic memory 715 from a machine-readable medium, for example the storage unit 725. In alternative embodiments, hard-wired circuitry can be used in place of or in combination with software instructions to implement various embodiments.

The term machine-readable medium can be defined as a medium providing content to a machine to enable the machine to perform a specific function. The machine-readable medium can be a storage media. Storage media can include non-volatile media and volatile media. The storage unit 725 can be non-volatile media. The electronic memory 715 can be a volatile medium. All such media must be tangible to enable the instructions carried by the media to be detected by a physical mechanism that reads the instructions into the machine.

Examples of the machine readable medium include, but are not limited to, a floppy disk, a flexible disk, hard disk, magnetic tape, a CD-ROM, optical disk, punchcards, papertape, a RAM, a PROM, EPROM, and a FLASH-EPROM.

The machine readable medium can also include online links, download links, and installation links providing the instructions to be executed by the processor 710.

The electronic device 702 also includes a communication interface 745 coupled to the bus 705 for enabling communication between one or more electronic devices via a network 750. Examples of the communication interface 745 include, but are not limited to, an integrated services digital network (ISDN) card, a modem, a local area network (LAN) card, an infrared port, a Bluetooth port, a zigbee port, and a wireless port.

In some embodiments, the processor 710 is responsive to the instructions to subject the electronic memory 715 to a first test condition of a predetermined set of test conditions. The processor 710 also tests functionality of the electronic memory 715 a first plurality of times, using a predetermined test algorithm. The processor 710 checks availability of a second test condition from the predetermined set of test conditions if the functionality of the electronic memory 715 is satisfactory. The processor 710 then tests the functionality of the electronic memory 715 a second plurality of times for the second test condition using the predetermined test algorithm, if the second test condition is available. The processor 710 further accepts the electronic memory 715 for use in a product if the functionality of the electronic memory 715 is satisfactory.

In some embodiments, the processor 710 can include one or more processing devices for performing one or more functions of the processor 710. The processing devices are hardware circuitry performing specified functions.

In the foregoing discussion, the term "coupled" refers to either a direct electrical connection between the devices connected or an indirect connection through intermediary devices.

The foregoing description sets forth numerous specific details to convey a thorough understanding of embodiments of the disclosure. However, it will be apparent to one skilled in the art that embodiments of the disclosure may be practiced without these specific details. Some well-known features are not described in detail in order to avoid obscuring the disclosure. Other variations and embodiments are possible in light of above teachings, and it is thus intended that the scope of disclosure not be limited by this Detailed Description.

What is claimed is:

1. A method of testing an electronic memory, the method comprising:
    subjecting the electronic memory to a first test condition of a predetermined set of test conditions;
    testing functionality of the electronic memory, a first plurality of times, using a predetermined test algorithm;
    when the functionality of the electronic memory is satisfactory, checking availability of a second test condition from the predetermined set of test conditions;
    when the second test condition is available, testing the functionality of the electronic memory, a second plurality of times, for the second test condition using the predetermined test algorithm; and
    when the functionality of the electronic memory is satisfactory, accepting the electronic memory for use in a product.

2. The method as claimed in claim 1 and further comprising discarding the electronic memory when the functionality of the electronic memory is unsatisfactory.

3. The method as claimed in claim 1 and further comprising accepting the electronic memory for use in a product when the second test condition is unavailable.

4. The method as claimed in claim 1, wherein the predetermined test algorithm comprises a March test algorithm.

5. The method as claimed in claim 4, wherein the March test algorithm comprises a March Random Telegraph Noise induced Failures (RTNF) algorithm as $\Uparrow$ (WO); $\Uparrow$ (W1); Delay; $\Uparrow$ (R1); Delay; $\Uparrow$ (R1); $\Uparrow$ (WO); Delay; $\Uparrow$ (RO); Delay; $\Uparrow$ (RO).

6. The method as claimed in claim 1, wherein the predetermined set of test conditions comprises a plurality of test conditions.

7. The method as claimed in claim 6 and further comprising testing functionality of the electronic memory for the plurality of test conditions using the predetermined test algorithm.

8. The method as claimed in claim 1, wherein the predetermined set of test conditions comprises a value of a power supply voltage applied to the electronic memory.

9. The method as claimed in claim 8, wherein the power supply voltage comprises a read command signal voltage applied to the electronic memory.

10. The method as claimed in claim 8, wherein the power supply voltage comprises a write command signal voltage applied to the electronic memory.

11. The method as claimed in claim 8, wherein the value of the power supply voltage applied to the electronic memory is a reduced value.

12. The method as claimed in claim 1, wherein the predetermined set of test conditions comprises temperature of the electronic memory.

13. The method as claimed in claim 12, wherein the temperature of the electronic memory is an increased value.

14. The method as claimed in claim 13, wherein the predetermined set of test conditions comprises a combination of a reduced value of a power supply voltage applied to the electronic memory and the increased value of the temperature for the electronic memory.

15. The method as claimed in claim 1, wherein testing the functionality of the electronic memory comprises one of
    testing the electronic memory for random telegraph noise induced failures;
    testing the electronic memory for a stuck-at fault;
    testing the electronic memory for a transition fault;
    testing the electronic memory for a read destructive fault;
    testing the electronic memory for a deceptive read destructive fault;
    and testing the electronic memory for a data retention fault.

16. The method as claimed in claim 1, wherein the electronic memory comprises a static random access memory.

17. One or more computer-readable non-transitory storage media embodying software that is operable when executed to:
- subject the electronic memory to a first test condition of a predetermined set of test conditions;
- test functionality of the electronic memory, a first plurality of times, using a predetermined test algorithm;
- when the functionality of the electronic memory is satisfactory, check availability of a second test condition from the predetermined set of test conditions;
- when the second test condition is available, test the functionality of the electronic memory, a second plurality of times, for the second test condition using the predetermined test algorithm; and
- when the functionality of the electronic memory is satisfactory, accept the electronic memory for use in a product.

18. The one or more computer-readable non-transitory storage media of claim 17, wherein the software is further operable when executed to discard the electronic memory when the functionality of the electronic memory is unsatisfactory.

19. The one or more computer-readable non-transitory storage media of claim 17, wherein the software is further operable when executed to accept the electronic memory for use in a product when the second test condition is unavailable.

20. The one or more computer-readable non-transitory storage media of claim 17, wherein the predetermined test algorithm comprises a March test algorithm.

21. The one or more computer-readable non-transitory storage media of claim 20, wherein the March test algorithm comprises a March Random Telegraph Noise induced Failures (RTNF) algorithm as ⇑(WO); ⇑(W1); Delay; ⇑(R1); Delay; ⇑(R1); ⇑(WO); Delay; ⇑(RO); Delay; ⇑(RO).

22. The one or more computer-readable non-transitory storage media of claim 17, wherein the predetermined set of test conditions comprises a plurality of test conditions.

23. The one or more computer-readable non-transitory storage media of claim 22, wherein the software is further operable when executed to
- test functionality of the electronic memory for the plurality of test conditions using the predetermined test algorithm.

24. The one or more computer-readable non-transitory storage media of claim 17, wherein the predetermined set of test conditions comprises a value of a power supply voltage applied to the electronic memory.

25. The one or more computer-readable non-transitory storage media of claim 24, wherein the power supply voltage comprises a read command signal voltage applied to the electronic memory.

26. The one or more computer-readable non-transitory storage media of claim 24, wherein the power supply voltage comprises a write command signal voltage applied to the electronic memory.

27. The one or more computer-readable non-transitory storage media of claim 24, wherein the value of the power supply voltage applied to the electronic memory is a reduced value.

28. The one or more computer-readable non-transitory storage media of claim 17, wherein the predetermined set of test conditions comprises temperature of the electronic memory.

29. The one or more computer-readable non-transitory storage media of claim 28, wherein the temperature of the electronic memory is an increased value.

30. The one or more computer-readable non-transitory storage media of claim 29, wherein the predetermined set of test conditions comprises a combination of a reduced value of a power supply voltage applied to the electronic memory and the increased value of the temperature for the electronic memory.

31. The one or more computer-readable non-transitory storage media of claim 17, wherein to test the functionality of the electronic memory the software is further operable when executed to perform one of
- testing the electronic memory for random telegraph noise induced failures;
- testing the electronic memory for a stuck-at fault;
- testing the electronic memory for a transition fault;
- testing the electronic memory for a read destructive fault;
- testing the electronic memory for a deceptive read destructive fault; and
- testing the electronic memory for a data retention fault.

32. The one or more computer-readable non-transitory storage media of claim 17, wherein the electronic memory comprises a static random access memory.

33. A system comprising:
- a communication interface in electronic communication with one or more electronic devices;
- an electronic memory that stores instructions;
- and a processor responsive to the instructions to
  - subject the electronic memory to a first test condition of a predetermined set of test conditions;
  - test functionality of the electronic memory, a first plurality of times, using a predetermined test algorithm;
  - check availability of a second test condition from the predetermined set of test conditions when the functionality of the electronic memory is satisfactory;
  - test the functionality of the electronic memory, a second plurality of times, for the second test condition using the predetermined test algorithm when the second test condition is available; and
  - accept the electronic memory for use in a product when the functionality of the electronic memory is satisfactory.

* * * * *